US012484255B2

(12) United States Patent
Sakai et al.

(10) Patent No.: US 12,484,255 B2
(45) Date of Patent: Nov. 25, 2025

(54) SEMICONDUCTOR DEVICE

(71) Applicant: Magnolia White Corporation, Tokyo (JP)

(72) Inventors: Takeshi Sakai, Tokyo (JP); Hajime Watakabe, Tokyo (JP); Akihiro Hanada, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 552 days.

(21) Appl. No.: 17/859,004

(22) Filed: Jul. 7, 2022

(65) Prior Publication Data

US 2023/0007861 A1 Jan. 12, 2023

(30) Foreign Application Priority Data

Jul. 8, 2021 (JP) ................................. 2021-113653

(51) Int. Cl.
*H10D 30/67* (2025.01)
*H10D 86/40* (2025.01)
*H10D 86/60* (2025.01)

(52) U.S. Cl.
CPC ..... *H10D 30/6755* (2025.01); *H10D 30/6734* (2025.01); *H10D 86/423* (2025.01); *H10D 86/441* (2025.01); *H10D 86/471* (2025.01); *H10D 86/60* (2025.01)

(58) Field of Classification Search
CPC ........... H01L 27/1251; H01L 29/78666; H01L 29/78669; G02F 1/136286; G02F 1/136285
See application file for complete search history.

(56) References Cited

U.S. PATENT DOCUMENTS

| 2013/0299819 | A1  | 11/2013 | Yamazaki et al. |
| 2019/0035818 | A1* | 1/2019  | Yamazaki ............. H01L 27/127 |
| 2020/0020756 | A1* | 1/2020  | Ueda ......................... G09F 9/30 |
| 2020/0259020 | A1  | 8/2020  | Watakabe et al. |
| 2021/0151475 | A1* | 5/2021  | Kim .................... H01L 29/6675 |

FOREIGN PATENT DOCUMENTS

| JP | 2013-254950 A | 12/2013 |
| JP | 2020-129635 A | 8/2020 |
| JP | 2021100123 A | 7/2021 |

OTHER PUBLICATIONS

Office Action issued Jan. 28, 2025, in corresponding JP Application No. 2021-113653, 6pp.

* cited by examiner

*Primary Examiner* — Brent A. Fairbanks
(74) *Attorney, Agent, or Firm* — XSENSUS LLP

(57) ABSTRACT

According to one embodiment, a semiconductor device includes a first transistor which includes a an oxide semiconductor layer, and a second transistor connected to first and a second gate electrodes of the first transistor, wherein the oxide semiconductor layer is provided between the first and second gate electrodes in a cross-sectional view, the oxide semiconductor layer includes a first channel formation region overlapping the second gate electrode and a second channel formation region not overlapping the second gate electrode in a plan view, and a resistance value between the second gate electrode and the second transistor is higher than a resistance value between the first gate electrode and the second transistor.

5 Claims, 3 Drawing Sheets

SEMICONDUCTOR DEVICE

CROSS-REFERENCE TO RELATED APPLICATIONS

This application is based upon and claims the benefit of priority from Japanese Patent Application No. 2021-113653 filed Jul. 8, 2021, the entire contents of which are incorporated herein by reference.

FIELD

Embodiments described herein relate generally to a semiconductor device.

BACKGROUND

In display devices, for example, liquid crystal displays, such a technology is proposed that a transistor comprising an oxide semiconductor is provided in pixel circuits in a display area, and further a transistor comprising a silicon semiconductor is provided in drive circuits in a peripheral area.

DETAILED DESCRIPTION

Figure 1:
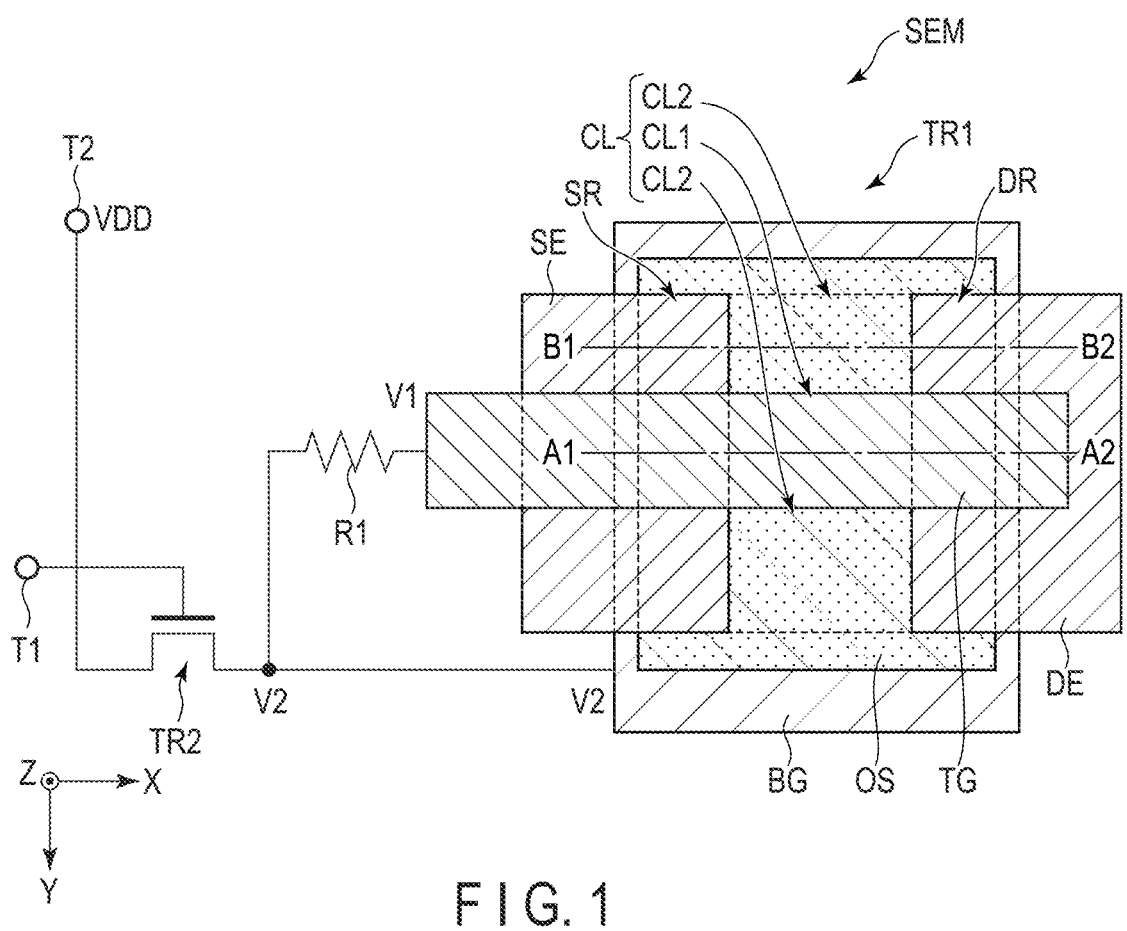
FIG. 1 is a diagram showing a brief configuration of a semiconductor device according to an embodiment.

In general, according to one embodiment, a semiconductor device comprises a first transistor comprising: a first gate electrode; an oxide semiconductor layer overlapping the first gate electrode; a source electrode and a drain electrode each overlapping the oxide semiconductor layer; and a second gate electrode overlapping a central portion of the oxide semiconductor layer; and a second transistor connected to the first gate electrode and the second gate electrode, wherein the oxide semiconductor layer is provided between the first gate electrode and the second gate electrode in a cross-sectional view, the oxide semiconductor layer includes a first channel formation region overlapping the second gate electrode and a second channel formation region not overlapping the second gate electrode in a plan view, and a resistance value between the second gate electrode and the second transistor is higher than a resistance value between the first gate electrode and the second transistor.

According to another embodiment, a semiconductor device comprises a first transistor comprising: a first gate electrode; an oxide semiconductor layer overlapping the first gate electrode; a source electrode and a drain electrode each overlapping the oxide semiconductor layer; and a second gate electrode overlapping a central portion of the oxide semiconductor layer; a second transistor connected to the first gate electrode and the second gate electrode; and a third transistor connected to the second gate electrode, wherein the oxide semiconductor layer is provided between the first gate electrode and the second gate electrode in a cross-sectional view, the oxide semiconductor layer includes a first channel formation region overlapping the second gate electrode and a second channel formation region not overlapping the second gate electrode in a plan view, and a threshold value of the third transistor is higher than a threshold value of the second transistor.

According to still another embodiment, a semiconductor device comprises a first transistor comprising: a first gate electrode; an oxide semiconductor layer overlapping the first gate electrode; a source electrode and a drain electrode each overlapping the oxide semiconductor layer; and a second gate electrode overlapping a central portion of the oxide semiconductor layer; and a second transistor connected to the first gate electrode and the second gate electrode, wherein the oxide semiconductor layer is provided between the first gate electrode and the second gate electrode in a cross-sectional view, the oxide semiconductor layer including a first channel formation region overlapping the second gate electrode and a second channel formation region not overlapping the second gate electrode in a plan view, and a voltage applied to the second gate electrode being 0V or less.

An object of the embodiment is to provide a semiconductor device which can suppress degradation of characteristics.

Embodiments will be described hereinafter with reference to the accompanying drawings. Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof may be omitted unless otherwise necessary.

A semiconductor device according to one embodiment will now be described with reference to the accompanying drawings.

In this embodiment, a first direction X, a second direction Y and a third direction Z are orthogonal to each other, but they may intersect at an angle other than 90 degrees. In the following descriptions, a direction forwarding a tip of an arrow indicating the third direction Z is referred to as "above" or "upward" and a direction forwarding oppositely from the tip of the arrow is referred to as "below" or "downward". Note that the first direction X, the second direction Y and the third direction Z may be referred to as an X direction, a Y direction and a Z direction, respectively.

With such expressions "a second member above a first member" and "a second member below a first member", the second member may be in contact with the first member or may be remote from the first member. In the latter case, a third member may be interposed between the first member and the second member. On the other hand, with such expressions "a second member on a first member" and "a second member on a first member", the second member is meant to be in contact with the first member.

In addition, it is assumed that there is an observation position to observe the semiconductor substrate on a tip side of an arrow in a third direction Z, and viewing from this observation position toward the X-Y plane defined by the first direction X and the second direction Y is referred to as a planar view. Viewing a cross section of the semiconductor device in an X-Z plane defined by the first direction X and the third direction Z or a Y-Z plane defined by the second direction Y and the third direction Z is referred to as a cross-sectional view.

EMBODIMENT

FIG. 1 is a diagram schematically showing a configuration of a semiconductor device of this embodiment. The semiconductor device SEM comprises a transistor TR1, a transistor TR2, a resistor element R1, a terminal T1 and a terminal T2.

The transistor TR1 includes a first gate electrode BG, an oxide semiconductor layer OS, a source electrode SE and a drain electrode DE. The first gate electrode BG is provided below the oxide semiconductor layer OS while interposing an insulating layer GI described below, therebetween. The second gate electrode TG is provided above the oxide semiconductor layer OS while interposing an insulating layer INS described later, therebetween. The first gate electrode BG and the second gate electrode TG may be referred to as a bottom gate and a top gate, respectively.

The first gate electrode BG, the source electrode SE, the drain electrode DE and the second gate electrode TG can be formed from a metal material, for example, a single layer of metallic film or a stacked multilayered film of a plurality of metallic films. Specific examples thereof include a molybdenum-tungsten alloy (MoW) film or a stacked multilayered film in which an aluminum alloy film is sandwiched between titanium films.

The oxide semiconductor layer OS is formed of indium gallium zinc oxide (IGZO), indium gallium zinc oxide (ITZO), and ITZO (indium tin oxide), zinc oxide nitride (ZnON), indium gallium oxide (IGO) or the like.

Regions of the oxide semiconductor layer OS, which overlap the source electrode SE and the drain electrode DE are defined as a source region SR and a drain region DR, respectively. Between the source region SR and the drain region DR, a channel formation region CL is provided.

A portion of the channel formation region CL overlaps the second gate electrode TG. More specifically, of the channel formation region CL, a central portion thereof along the channel width direction overlaps the second gate electrode TG. Of the channel formation region CL, the region which overlaps the second gate electrode TG is referred to as the channel formation region CL1, and the region which does not overlap the second gate electrode TG is referred to as the channel formation region CL2.

Figure 2:
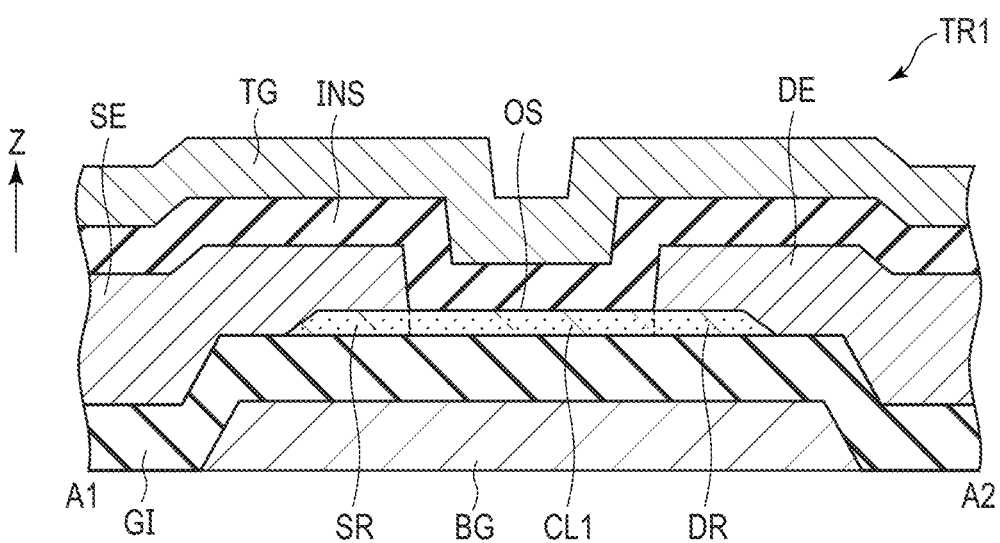
FIG. 2 is a cross-sectional view of a transistor taken along line A1-A2 in FIG. 1.

FIG. 2 is a cross-sectional view of the transistor shown in FIG. 1, taken along line A1-A2. To cover the first gate electrode BG, an insulating layer GI is provided. The insulating layer GI is formed of silicon oxide, for example.

On the insulating layer GI, an oxide semiconductor layer OS is provided at a position opposing the first gate electrode BG.

On the oxide semiconductor layer OS, a source electrode SE and a drain electrode DE are provided on the oxide semiconductor layer OS to overlap portions thereof, respectively. In FIG. 2, of the oxide semiconductor layer OS, the region between the source electrode SE and the drain electrode DE is the channel formation region CL1.

To cover the oxide semiconductor layer OS, the source electrode SE and the drain electrode DE, an insulating layer INS is provided. The insulating layer INS is formed of silicon oxide, for example.

On the insulating layer INS, a second gate electrode TG is provided to oppose the oxide semiconductor layer OS and the first gate electrode BG.

Figure 3:
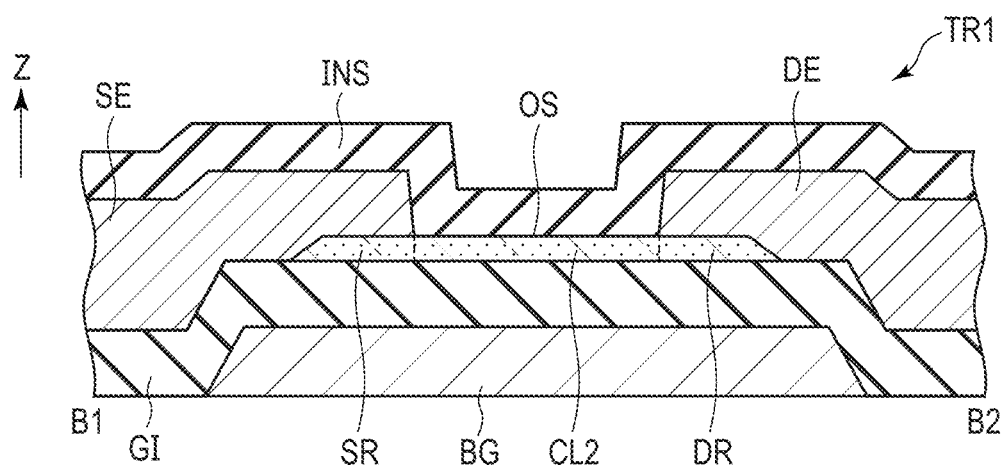
FIG. 3 is a cross-sectional view of the transistor taken along line B1-B2 in FIG. 1.

FIG. 3 is a cross-sectional view of the transistor shown in FIG. 1, taken along line B1-B2. As shown in FIG. 3, the second gate electrode TG is not provided in the cross-sectional view of the transistor TR1.

In FIG. 3, of the oxide semiconductor layer OS, the region between the source electrode SE and the drain electrode DE is the channel formation region CL2.

With reference back to FIG. 1, the semiconductor device SEM will be described. The second gate electrode TG of transistor TR1 is connected to one of terminals of the resistor element R1. The other terminal of the resistor element R1 is connected to the scanning line which connects the first gate electrode BG to the drain region of transistor TR2. The source region of the transistor TR2 is connected to the terminal T2. The gate electrode of the transistor TR2 is connected to the terminal T1.

The transistor TR2 is connected to the first gate electrode BG of the transistor TR1 via a scanning line (referred to as a gate line as well). Although not shown in FIG. 1, the semiconductor device SEM is provided with a plurality of transistors TR2, which constitute a scanning-line drive circuit (referred to as a gate driver as well).

The resistor element R1 is, for example, a high-resistance metal wiring line. It suffices if the metal wiring line has a resistance higher than that of the wiring line connecting the drain region of the transistor TR2 and the first gate electrode BG. Alternatively, the wiring width of the portion corresponding to the resistive element R1 in the wiring line connecting from the scanning line to the second gate electrode TG may be reduced, or the wiring length of the portion corresponding to the resistance element R1 in the wiring line may be increased when forming the resistance element R1.

To the terminal T1, voltages which control an on state and an off state of the transistor TR2 are applied. To the terminal T2, a voltage given to the source region of the transistor TR2 is applied.

When the transistor TR2 is in the on state, a voltage VDD applied to the terminal T2 is applied to the first gate electrode BG via the transistor TR2. Here, the voltage applied to the first gate electrode BG is set to V2. On the other hand, since the resistor element R1 is provided between the second gate electrode TG and the drain region of the transistor TR2, a voltage V1 (<V2), which is lower than the voltage V2 is applied to the second gate electrode TG.

In the wiring line connecting the first gate electrode BG and the drain region of transistor TR2, there is also a wiring resistance. However, the resistance value of the resistor element R1 is higher than the resistance of the wiring line. A voltage drop occurs in the resistor element R1, and the voltage V1 becomes lower than the voltage V2.

Here, let us consider a configuration in which the second gate electrode TG is not provided in the transistor TR1. The oxide semiconductor layer OS has different degrees of oxidation in a region near its end portion in plan view as compared to a region near its central portion, which is distant from the end portion. This is because oxygen can more easily enter from the outside to the end portion of the oxide semiconductor layer OS, than to the central portion. In the channel formation region CL between the source electrode SE and the drain electrode DE, this may cause a difference between the current flowing in the end portion and that flowing in the central portion, resulting in a difference in threshold voltage. Thus, hump characteristics occur, in which a bend appears in the voltage-current characteristics of the transistor TR1. As a result, the characteristics of the transistor TR1 may be degraded.

In this embodiment, by providing the second gate electrode TG, which is the top gate, in the region near the central portion of the oxide semiconductor layer OS, the channel formation region CL1 located in the central portion and the channel formation region CL2 located in the end portion are formed. The channel formation region CL1 is controlled by a voltage applied from the second gate electrode TG, which is lower than the voltage applied to the first gate electrode BG. With this configuration, the threshold of the channel formation region CL1 can be positively shifted. Therefore, the degradation in characteristics of the transistor TR1 can be suppressed.

The transistor TR1 of this embodiment can be used, for example, in a pixel circuit of a display device. In such a case, the transistor TR1 may be provided in the display area of the display device and the transistor TR2 may be provided in the non-display area (peripheral area) of the display device. Here, the transistor TR2 may be a thin-film transistor whose channel formation region is formed from a silicon layer.

In this embodiment, the voltage applied to the top gate is lower than the voltage applied to the bottom gate. The threshold voltage in the channel formation region which overlaps the top gate is positively shifted and thus the occurrence of the hump characteristics is suppressed. According to this embodiment, it is possible to provide a semiconductor devices in which the degradation of the characteristics can be suppressed.

Configuration Example 1

Figure 4:
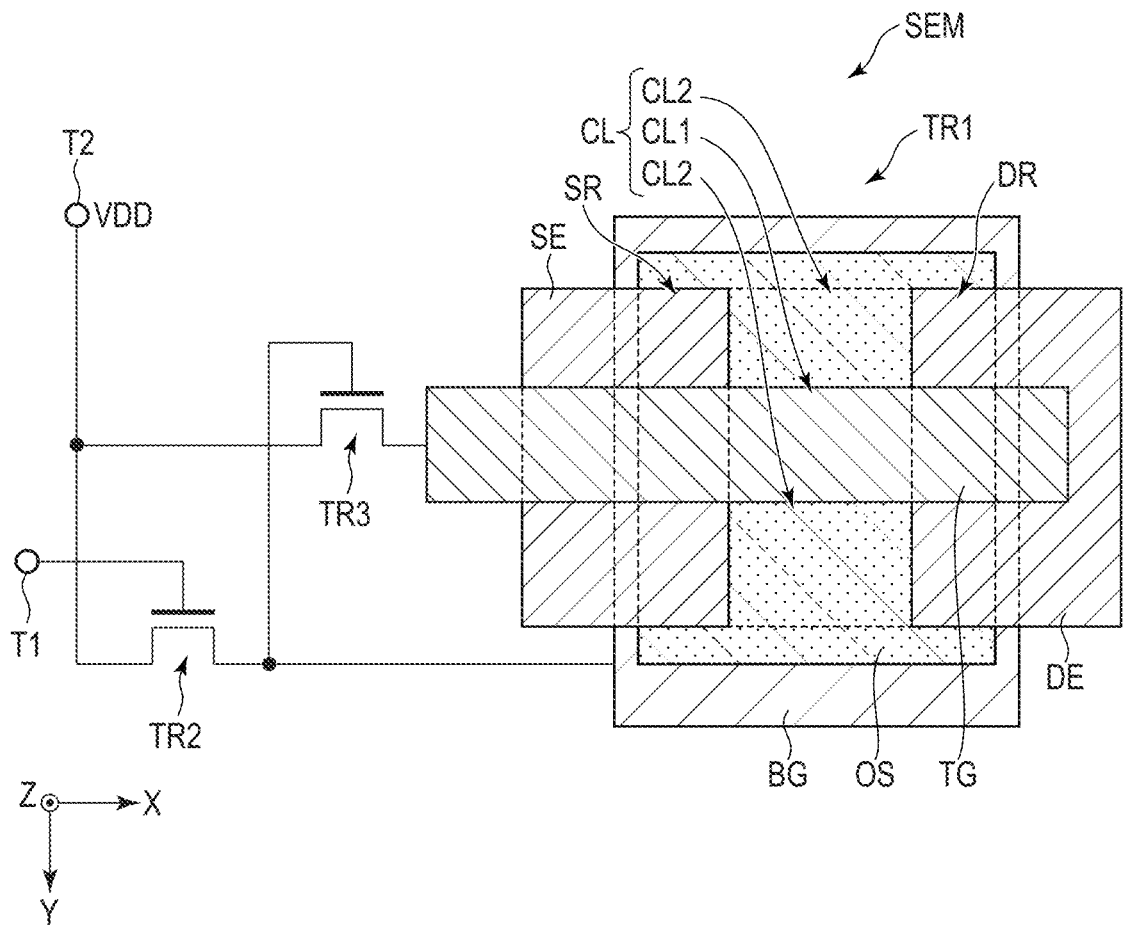
FIG. 4 is a plan view of another configuration example of the semiconductor device in the embodiment.

FIG. 4 is a plan view of another configuration example of the semiconductor device according to the embodiment. The configuration example shown in FIG. 4 is different from that of FIG. 1 in that it comprises a transistor connected to the top gate.

The semiconductor device SEM shown in FIG. 4 comprises a transistor TR1, a transistor TR2, a transistor TR3, a terminal T1 and a terminal T2.

The transistor TR3 is a transistor having a threshold higher than that of the transistor TR2. The transistor TR3, as in the case of the transistor TR2, may be a thin-film transistor whose channel formation region is formed from a silicon layer. For example, the threshold can be made higher by changing the channel length or channel width of the channel formation region of the transistor TR3. Alternatively, the threshold of the transistor TR3 can be changed by changing the crystallinity of the silicon thin film including the channel formation region.

The gate electrode of the transistor TR3 is connected to the drain region of the transistor TR2. The source region of the transistor TR3 is connected to the terminal T2 and the source region of the transistor TR2. The drain region of the transistor TR3 is connected to the second gate electrode TG.

As described above, the threshold value of the transistor TR3 is higher than that of the transistor TR2. In this case, the voltage is applied to the second gate electrode TG with a delay as compared to the first gate electrode BG. Here, even though the transistor TR2 is in the on state, the transistor TR3 is in the off state. Thus, the voltage can be applied only to the first gate electrode BG without applying voltage to the second gate electrode TG.

In this configuration example as well, an advantageous effect similar to that of the embodiment can be obtained.

Configuration Example 2

Figure 5:
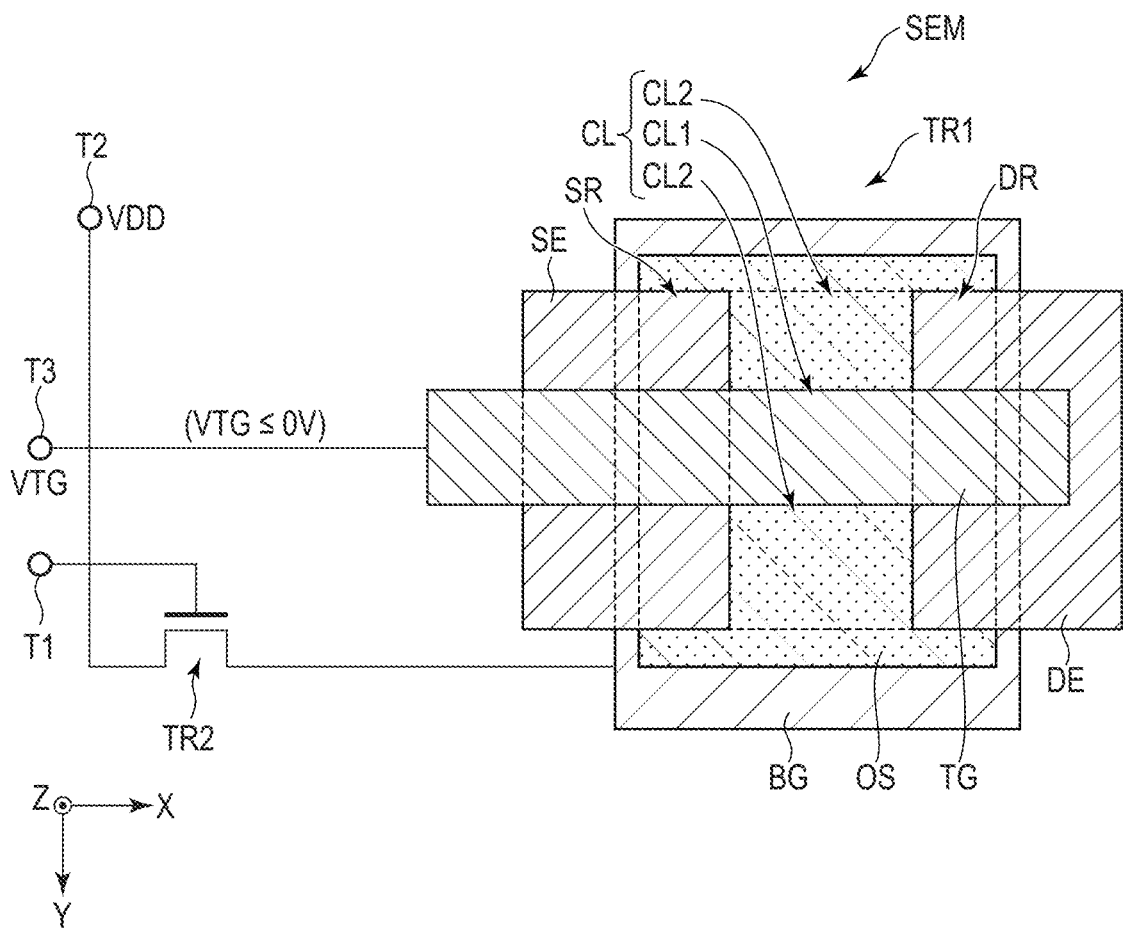
FIG. 5 is a plan view of still another configuration example of the semiconductor device in the embodiment.

FIG. 5 is a plan view of still another configuration example of the semiconductor device in the embodiment. The configuration example shown in FIG. 5 is different from that of FIG. 1 in that voltage is directly applied to the top gate. The semiconductor device SEM shown in FIG. 5 comprises a transistor TR1, a transistor TR2, a terminal T1, a terminal T2 and a terminal T3.

The terminal T3 is connected to the second gate electrode TG. Via the terminal T3, a voltage VTG is applied to the second gate electrode TG from the outside. The voltage VTG is set to 0V or less. In this case, only the first gate electrode BG of the transistor TR1 is in the on state, and the current flowing in the transistor TR1 decreases.

According to this configuration example, it is possible to prevent the occurrence of the hump characteristics without separately providing a transistor having a resistance or a high threshold value as described above.

In this configuration example as well, an advantageous effect similar to that of the embodiment can be obtained.

In this disclosure, the transistors TR1, TR2 and TR3 are referred to as the first transistor, the second transistor and the third transistor, respectively. The first gate electrode BG and the second gate electrode TG are referred to as the first gate electrode and the second gate electrode, respectively. The channel formation regions CL1 and CL2 are referred to as the first channel formation region CL1 and the second channel formation region CL2, respectively.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device comprising:
a first transistor comprising:
   a first gate electrode;
   an oxide semiconductor layer overlapping the first gate electrode;
   a source electrode and a drain electrode each overlapping the oxide semiconductor layer; and
   a second gate electrode overlapping a central portion of the oxide semiconductor layer;
a second transistor connected to the first gate electrode and the second gate electrode; and
a metal wiring line provided between the second gate electrode and the second transistor, wherein
the oxide semiconductor layer is provided between the first gate electrode and the second gate electrode in a cross-sectional view,
the oxide semiconductor layer includes a first channel formation region overlapping the second gate electrode and a second channel formation region not overlapping the second gate electrode in a plan view, a resistance value between the second gate electrode and the second transistor is higher than a resistance value between the first gate electrode and the second transistor, and the metal wiring has a higher resistance value than that of a wiring line provided between the first gate electrode and the second transistor.

2. The semiconductor device according to claim 1, wherein the second transistor is a thin-film transistor of which a channel formation region is formed from a silicon layer.

3. A semiconductor device comprising:
a first transistor comprising:
a first gate electrode;
an oxide semiconductor layer overlapping the first gate electrode;
a source electrode and a drain electrode each overlapping the oxide semiconductor layer;
a second gate electrode overlapping a central portion of the oxide semiconductor layer;
a second transistor connected to the first gate electrode and the second gate electrode; and
a metal wiring line provided between the second gate electrode and the second transistor, wherein
the oxide semiconductor layer is provided between the first gate electrode and the second gate electrode in a cross-sectional view,
the oxide semiconductor layer includes a first channel formation region overlapping the second gate electrode and a second channel formation region not overlapping the second gate electrode in a plan view,
a resistance value between the second gate electrode and the second transistor is higher than a resistance value between the first gate electrode and the second transistor, and the metal wiring line has a less width and than that of a wiring line provided between the first gate electrode and the second transistor.

4. The semiconductor device according to claim 3, wherein the second transistor is a thin-film transistor of which a channel formation region is formed from a silicon layer.

5. A semiconductor device comprising:
a first transistor comprising:
a first gate electrode;
an oxide semiconductor layer overlapping the first gate electrode;
a source electrode and a drain electrode each overlapping the oxide semiconductor layer; and
a second gate electrode overlapping a central portion of the oxide semiconductor layer;
a second transistor connected to the first gate electrode and the second gate electrode; and
a third transistor connected to the second gate electrode, wherein
the oxide semiconductor layer is provided between the first gate electrode and the second gate electrode in a cross-sectional view,
the oxide semiconductor layer includes a first channel formation region overlapping the second gate electrode and a second channel formation region not overlapping the second gate electrode in a plan view,
a threshold value of the third transistor is higher than a threshold value of the second transistor, and
the second transistor and the third transistor are each a thin-film transistor of which a channel formation region is formed from a silicon layer.

* * * * *